(12) United States Patent
Ohkura et al.

(10) Patent No.: US 6,218,318 B1
(45) Date of Patent: *Apr. 17, 2001

(54) SEMICONDUCTOR DEVICE HAVING A POROUS INSULATION FILM

(75) Inventors: Yoshiyuki Ohkura, Kawasaki; Hideki Harada, Satsuma-gun, both of (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/018,855

(22) Filed: Feb. 4, 1998

(30) Foreign Application Priority Data

Feb. 5, 1997 (JP) .................................................. 9-023018

(51) Int. Cl.[7] .............................................. H07L 21/4163
(52) U.S. Cl. ......................... 438/782; 438/622; 438/623; 438/624; 438/637; 438/778; 438/781; 438/791; 438/FOR 395; 427/96; 427/189; 427/204; 427/214; 148/DIG. 81
(58) Field of Search ..................................... 438/622, 623, 438/624, 781, 782, 778, 790, 637, FOR 395; 427/96, 189, 204, 214; 148/DIG. 81

(56) References Cited

U.S. PATENT DOCUMENTS

| | | | |
|---|---|---|---|
| 4,141,055 | * | 2/1979 | Berry et al. ........................... 361/410 |
| 4,865,875 | * | 9/1989 | Kellerman .............................. 427/96 |
| 5,055,342 | * | 10/1991 | Markovich et al. .................. 428/137 |
| 5,354,611 | * | 10/1994 | Arthur et al. .......................... 428/325 |
| 5,453,293 | * | 9/1995 | Beane et al. ............................. 427/96 |
| 5,578,523 | * | 11/1996 | Fiordalice et al. .................... 437/190 |
| 5,614,250 | * | 3/1997 | Diener et al. ........................... 427/96 |
| 5,739,579 | * | 4/1998 | Chiang et al. ........................ 257/635 |
| 5,741,626 | * | 4/1998 | Jain et al. .............................. 430/314 |
| 5,776,828 | * | 7/1998 | Givens ................................. 438/631 |
| 5,801,092 | * | 9/1998 | Ayers .................................... 438/623 |
| 5,837,603 | * | 11/1998 | Linn et al. ............................ 438/622 |
| 5,851,915 | * | 12/1998 | Miyakawa ............................ 438/622 |
| 5,877,080 | * | 3/1999 | Aoi et al. ............................. 438/622 |

FOREIGN PATENT DOCUMENTS

| | | | |
|---|---|---|---|
| 58056456 | * | 4/1983 | (JP) . |
| 6-97298 | * | 4/1994 | (JP) .............................. 438/FOR 395 |
| 407112126 | * | 5/1995 | (JP) . |

OTHER PUBLICATIONS

Wolf, Stanley, "Silicon Processing for the VLsI Era", vol. 1, p. 184, 1986.*
Wolf, Stanley, "Silicon Processing for the VLSI Era", vol. 2, pp. 188 and 273–275, 1990.*
El–Kareh, Badih, Fundamentals of Semiconductor Processig Technology, pp. 572, 1995.*

* cited by examiner

Primary Examiner—Charles Bowers
Assistant Examiner—Lisa Kilday
(74) Attorney, Agent, or Firm—Armstrong, Westerman, Hattori, McLeland & Naughton

(57) ABSTRACT

A semiconductor device includes a porous interlayer insulation film including therein a stacking of $SiO_2$ particles having a diameter in the range between about 5 nm and about 50 nm and stacked so as to form a void between adjacent particles, wherein the interlayer insulation film has a porosity in the range between about 13% and about 42%.

9 Claims, 16 Drawing Sheets

SEMICONDUCTOR DEVICE HAVING A POROUS INSULATION FILM

BACKGROUND OF THE INVENTION

The present invention generally relates to semiconductor devices and more particularly to a high-speed semiconductor device with an interlayer insulation film having a low permittivity.

In a semiconductor integrated circuit in which a large number of semiconductor devices are integrated on a common substrate, a multilayer interconnection structure is generally used for interconnecting the semiconductor devices. In such a multilayer interconnection structure, a first-layer interconnection pattern is covered by a first-layer interlayer insulation film, and a second-layer interconnection pattern is provided on such a first-layer interlayer insulation film. The second-layer interconnection pattern is then covered by a second-layer interlayer insulation film and a third-layer interconnection pattern is provided on the second-layer interlayer insulation film.

When using such an interlayer insulation structure in high-speed semiconductor devices such as a logic device or a high-speed memory device, it is desired that the insulation film forming the interlayer insulation film has a permittivity as low as possible. In an extremely miniaturized semiconductor device called sub-halfmicron devices in which the design rule is 0.3 $\mu$m or less, in particular, there is a tendency that an electrostatic induction between adjacent conductor patterns invites an increase in the impedance, which in turn causes a delay in response or increase of the electric power consumption.

On the other hand, the insulation film used for such an interlayer insulation film is required to form a flat, planarized structure in view of the fact that a further conductor pattern may be formed thereon, so that the conductor pattern formed on the interlayer insulation film is not disconnected by a stepped structure formed on the interlayer insulation film. Such a planarization of the interlayer insulation film is also essential in view of the process of formation of the minute interconnection pattern, which is conducted by using a high-resolution optical exposure system. As the interlayer insulation film is provided so as to bury the underlying conductor patterns, it is necessary that the interlayer insulation film is applied in a low-viscosty fluid state such that the shape of the conductor pattern is not transferred to the surface of the interlayer insulation film.

In view of the foregoing, it has been practiced to form an interlayer insulation film having a planarized top surface by depositing an $SiO_2$ film by a high-density plasma CVD process, followed by a chemical mechanical polishing process (CMP). However, the insulation film formed according to such a process has a permittivity of about 3.5 or higher even in the case in which a F-doping is conducted to the $SiO_2$ film. Further reduction of the permittivity is extremely difficult.

It is also known that a low-permittivity interlayer insulation film may be obtained by using F-doped polyimide or a fluorocarbon resin in place of the conventional CVD-$SiO_2$ films. Such organic insulation films are formed typically by a coating process such as a spin-coating process. By using the organic insulation film, the permittivity of the interlayer insulation film can be reduced to about 2.

On the other hand, such organic insulation film suffers from a problem of poor adhesion and there is a tendency that the insulation film peels off. Further, the organic insulation film has a problem in that the adhesion to a resist film, which is used for patterning the conductor patterns, is also unsatisfactory. In addition, the organic insulation film has a problem of poor resistance to various chemicals used in the fabrication process of semiconductor devices or to a plasma process conducted in an oxygen plasma.

Further, it is proposed to use a film-forming organic silica known as SOG for the interlayer insulation film. An SOG is a liquid formed of a partial hydrolysis of alkoxysilane. In this case, too, a silica film having a permittivity of about 2.5 is obtained. However, such an SOG film also suffers from the problem of poor adhesion to the underlying layer. In a typical case of the conventional SOG film that is formed of a hydrolysate of alkoxysilane or halonagated silane, the density of the Si—O—Si bonds in the film is reduced due to the existence of a hydrogen atom, fluorine atom or organic group bonded to the Si atoms, and there appears various problems, although the film may have a low permittivity as noted before, such as poor thermal stability caused as a result of poor thermal stability of the functional groups forming the film, in addition to the problem of the poor adherence to the underlying layer.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device having an interlayer insulation film wherein the interlayer insulation film forms a spontaneous planarized surface even when provided on an irregular underlying structure.

Another object of the present invention is to provide a semiconductor device having an interlayer insulation film wherein the interlayer insulation film has low permittivity, excellent adherence to an underlying layer, high mechanical strength, high resistance to chemicals such as alkalis and high resistance to cracking.

Another object of the present invention is to provide a semiconductor device, comprising:
  a substrate;
  an interconnection layer provided on said substrate, said interconnection layer including an interconnection pattern; and
  a porous interlayer insulation film provided on said interconnection layer so as to cover said interconnection pattern, said porous interlayer insulation film including a stacking of particles,
  wherein said particles are formed of $SiO_2$ particles having a diameter in the range between about 5 nm and about 50 nm and stacked so as to form a void between adjacent particles, and
  wherein said interlayer insulation film has a porosity in the range between about 13% and about 42%.

Another object of the present invention is to provide a semiconductor device, comprising:
  a substrate;
  a porous interlayer insulation film provided on said substrate, said porous interlayer insulation film including a stacking of particles; and
  a CVD oxide film provided on said porous interlayer insulation film such that said CVD oxide film does not fill a void in said porous interlayer insulation film substantially,
  wherein said particles are formed of $SiO_2$ particles having a diameter in the range between about 5 nm and about 50 nm, and wherein said void is formed in said porous interlayer insulation film between said particles.

According to the present invention, the permittivity of the interlayer insulation film can be reduced substantially by forming the interlayer insulation film in a porous state, while maintaining excellent planarization.

Another object of the present invention is to provide a method of fabricating a semiconductor device, comprising the steps of:

applying a film-forming liquid on an underlying structure, said film-forming liquid including therein $SiO_2$ particles and a binder; and heating said underlying structure applied with said film-forming liquid to form an insulation film thereon such that said insulation film includes said $SiO_2$ particles and pores formed between said $SiO_2$ particles, wherein said $SiO_2$ particles have a diameter in the range between about 5 nm and about 50 nm, and wherein said step of heating is conducted at a temperature in the range between about 350° C. and about 400° C., in an inert gas atmosphere containing oxygen with a concentration of 1% or less.

According to the present invention, a porous interlayer insulation film having a low permittivity is formed with an excellent adherence to an underlying structure, while maintaining an excellent planarization.

Another object of the present invention is to provide a method of fabricating a semiconductor device, comprising the steps of:

forming an interlayer insulation film on a semiconductor structure; and forming a CVD insulation film on said interlayer insulation film;

said step of forming said interlayer insulation film including the steps of:

applying a film-forming liquid on said semiconductor structure, said film-forming liquid containing therein $SiO_2$ particles and a binder; and heating said semiconductor structure applied with said film-forming liquid to form an insulation film thereon such that said insulation film includes said $SiO_2$ particles and a void is formed between said $SiO_2$ particles, and wherein said step of forming said CVD insulation film is conducted such that said CVD insulation film does not penetrate into said pore inside said interlayer insulation film substantially.

According to the present invention, the problem of unwanted increase of permittivity of the porous interlayer insulation film, caused by the penetration of the CVD insulation film into the porous interlayer insulation film at the time of deposition of the CVD insulation film, is successfully avoided.

Another object of the present invention is to provide a method of fabricating a semiconductor device, comprising the steps of:

forming a first interlayer insulation film on an underlying semiconductor structure;

forming a first CVD film on said first interlayer insulation film by a CVD process;

forming a first opening in said first CVD film;

forming a second interlayer insulation film on said first CVD film;

forming a second CVD film on said second interlayer insulation film;

forming a second opening in said second CVD film in correspondence to said first opening, such that said second opening has a size larger than said first opening;

forming a groove in said second interlayer insulation film in correspondence to said second opening, by applying a dry etching process acting selectively to said second interlayer insulation film through said second opening, such that said groove penetrates through said second interlayer insulation film;

forming a through-hole in said first interlayer insulation film in correspondence to said first opening, by applying a dry etching process acting selectively to said first interlayer insulation film through said groove and through said first opening; and filling said groove and said through-hole by a conductor pattern;

wherein said first interlayer insulation film is formed by: applying a film-forming liquid containing therein $SiO_2$ particles having a diameter in the range between about 5 nm and about 50 nm and a binder, on said semiconductor structure; and heating said semiconductor structure applied with said film-forming liquid to form said first interlayer insulation film such that said first interlayer insulation film includes a void therein between said $SiO_2$ particles; and wherein said second interlayer insulation film is formed by: applying a film-forming liquid containing therein $SiO_2$ particles having a diameter in the range between about 5 nm and about 50 nm and a binder, on said first CVD film; and heating said first CVD film applied with said film-forming liquid to form said second interlayer insulation film such that said second interlayer insulation film includes a void therein between said $SiO_2$ particles;

said step of forming said through-hole in said first interlayer insulation film being conducted continuously to said step of forming said groove in said second interlayer insulation film.

Another object of the present invention is to provide a method of fabricating a semiconductor device, comprising the steps of:

forming a first interlayer insulation film on an underlying semiconductor structure;

forming a first CVD film on said first interlayer insulation film by a CVD process;

forming a second interlayer insulation film on said first CVD film;

forming a second CVD film on said second interlayer insulation film;

forming an opening consecutively through said second CVD film, said second interlayer insulation film, said first CVD film and said first interlayer insulation film; and forming a groove in said second CVD film and said second interlayer insulation film in correspondence to said opening, by applying a dry etching process to said second interlayer insulation film while using said first CVD film as an etching stopper, such that said groove penetrates through said second interlayer insulation film, wherein said first interlayer insulation film is formed by: applying a film-forming liquid containing therein $SiO_2$ particles having a diameter in the range between about 5 nm and about 50 nm and a binder, on said semiconductor structure; and heating said semiconductor structure applied with said film-forming liquid to form said first interlayer insulation film such that said first interlayer insulation film includes a void therein between said SiO$_2$ particles; and wherein said second interlayer insulation film is formed by: applying a film-forming liquid containing therein SiO$_2$ particles having a diameter in the range between about 5 nm and about 50 nm and a binder, on said first CVD film; and heating said first CVD film applied with said film-forming liquid to form said second interlayer insulation film such that said second interlayer insulation film includes a void therein between said SiO$_2$ particles.

According to the present invention, it is possible to form a damascene structure in which an interconnection pattern is embedded in an interlayer insulation film, is successfully obtained while using the porous interlayer insulation film.

Other objects and further features of the present invention will become apparent from the following detailed description when read in conjunction with the attached drawings.

DETAILED DESCRIPTION OF THE PREFERRED EMBODIMENTS

[PRINCIPLE]

Figure 1:
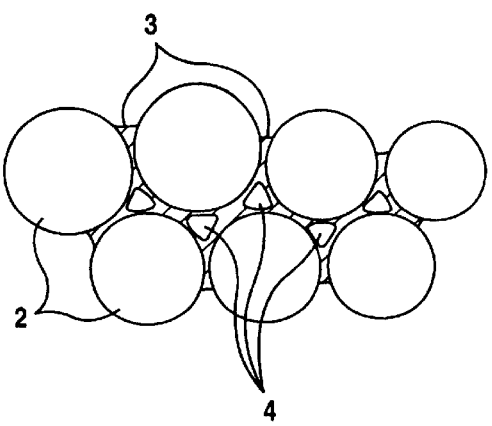
FIG. 1 is a diagram showing the principle of the present invention.

FIG. 1 shows the principle of the present invention, wherein it should be noted that FIG. 1 shows the structure of an interlayer insulation film 10 according to the present invention in an enlarged scale.

Referring to FIG. 1, the interlayer insulation film 10 has a structure in which minute silica (SiO$_2$) particles 2 having a diameter of 5–50 nm and formed of hydrolysis of alkoxide, are stacked such that adjacent silica particles 2 are connected with each other by a bonding part 3 also formed of silica. It should be noted that the bonding part 3 forms a reduced neck part, and three or more of the silica particles 2 define therebetween a void 4. In the structure of the present invention, the voids 4 thus formed occupy about 13–42% of the volume in the interlayer insulation film 10. In other words, the interlayer insulation film 10 has a porous structure. As a result of the existence of the void 4, the SiO$_2$ film 10 shows a permittivity significantly smaller as compared with the case of a dense SiO$_2$ film.

In the case when the SiO$_2$ particles 2 have a permittivity of 4.2 and the void 4 has a permittivity of 1.0, the interlayer insulation film 10 is evaluated to show an overall permittivity of 3.0 when the porosity in the film 10 is 13%. When the porosity is increased to 22%, on the other hand, the overall permittivity of the insulation film 10 becomes about 2.5. Further, when the porosity is increased to 42%, the overall permittivity becomes about 1.8. In the actual measurement of the permittivity conducted on the interlayer insulation film 10, it was revealed that the film 10 that has a permittivity of 2.5 indeed has a porosity of about 25%.

The silica particles 2 may be formed by a hydrolysis and polycondensation of alkoxysilane or a silica compound represented by a general formula of (I) X$_n$Si(OR')$_{4-n}$ (X may be a hydrogen atom, a fluorine atom or any of an alkyl group, an allyl group or a vinyl group containing 1–8 carbon atoms, R' represents a hydrogen atom or any of an alkyl group, an allyl group or a vinyl group containing 1–8 carbon atoms, n is an integer of 0–3), while the bonding part 3 is formed of a hydrolysate of alkoxysilane represented by the foregoing formula (I) or halogenated silane represented by a general formula (II) X$_n$SiX'$_{4-n}$ (X represents a hydrogen atom, a fluorine atom or any of an alkyl group, an allyl group or a vinyl group containing 1–8 carbon atoms, X' represents a halogen atom such as a fluorine atom, a chlorine atom, a bromine atom or an iodine atom, and n is an integer in the range of 0–3).

It should be noted that the silica particles are formed by conducting the hydrolysis and polycondensation of the hydrolysate of the foregoing alkoxysilane or halogenated silane under the existence of water, an organic solvent and a catalyst, wherein the alkoxysilane may be selected from any of tetramethoxysilane, tetraethoxysilane, tetraisopropoxysilane, tetrabutoxysilane, tetraoctylsilane, methyltrimethoxysilane, methyltriisopropoxysilane, ethyltrimethoxysilane, ethyltriethoxysilane, ethyltriisopropoxysilane, octyltrimethoxysilane, octyltriethoxysilane, vinyltriethoxysilane, phenyltriethoxysilane, phenyltrimethoxysilane, trimethoxysilane, triethoxysilane, triisopropoxysilane, fluorotrimethoxysilane, fluorotriethoxysilane, dimethylmethoxysilane, dimethylethoxysilane, dimethylmethoxysilane, diethyldiethoxysilane, dimethoxysilane, difluoromethoxysilane, trifluoromethyltrimethoxysilane, trifluoromethyltriethoxysilane, and the like. The organic solvent may be selected from alcohols, ketones, ethers or esters, wherein the alcohols include methanol, ethanol, propanol, butanol, and the like, while the ketones may include methylethylketone, methylisobutylketone, and the like. Further, the esters may include methylacetate, ethylacetate, methyllactate, ethyllactate, and the like. Further, it is also possible to use a glycol such as methylcellosolve, ethylcellosolve, propyleneglycol, hexylglycol, and the like. The catalyst may be selected from basic compounds such as ammonias, amines, alkali metal compounds, quaternary ammonium compounds, amine coupling agents, and the like.

When forming the silica particles, it is preferable to use the water with a proportion of 0.5–50 moles, preferably 1–25 moles with respect to one mole of Si—OR group forming the foregoing alkoxysilane. Further, the ammonia is used with a proportion of 0.01–1 mole, preferably 0.05–0.8 moles with respect to one mole of $SiO_2$.

It should be noted that the hydrolysis reaction is conducted at a temperature below the boiling point of the solvent, preferably at the temperature lower than the boiling point by 5–10° C. As a result of the hydrolysis reaction at such a low temperature, the polycondensation reaction of the alkoxysilane proceeds three-dimensionally to form the ultrafine silica particles. By curing the silica particles thus formed at the foregoing reaction temperature or at a higher temperature, the polycondensation reaction proceeds further and the silica particles have a more dense structure.

The silica particles 2 and the binder forming the bonding part 3 are dispersed in a solvent of glycolether to form a coating solution. The coating solution thus formed is then applied on a substrate by various processes such as a spray coating process, spin coating process, dip coating process or a roll coating process. By heating the substrate thus applied with the coating solution, it is possible to form the insulation film 10 such that the insulation film has a specific dielectric constant or permittivity of 3 or less.

Figure 2:
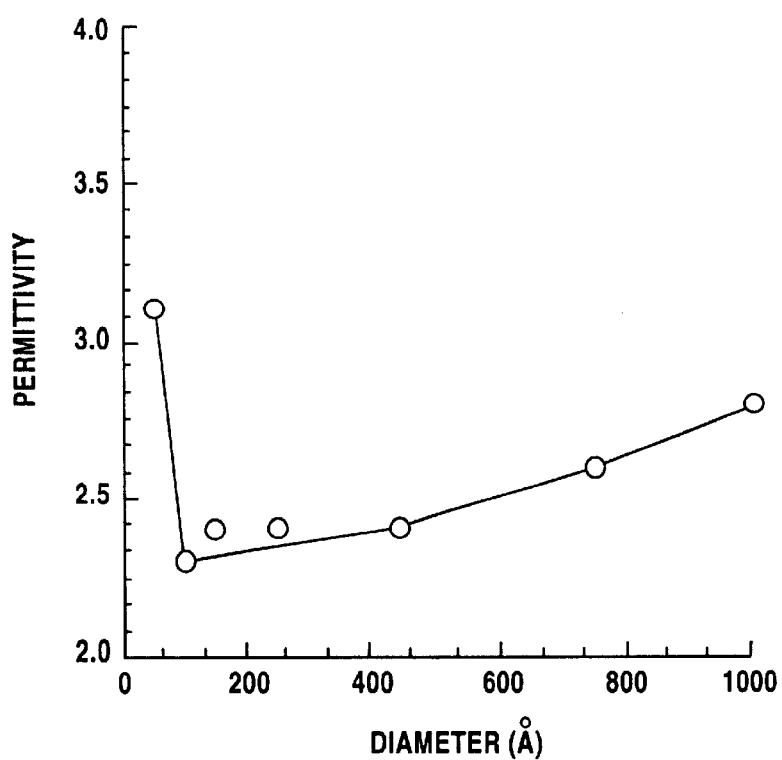
FIG. 2 is a diagram showing the relationship between the permittivity of the insulation film of the present invention and the diameter of silica particles forming the insulation film.

FIG. 2 shows the relationship between the permittivity of the insulation film 10 thus formed and the diameter of the silica particles.

Referring to FIG. 2, the relative permittivity of the film 10 decreases generally with decreasing diameter of the silica particles, while the relative permittivity starts to increase sharply when the diameter of the silica particles decreases below about 10 nm (100 Å). From the relationship of FIG. 2, it can be seen also that the permittivity of the film remains below 3.0 when the diameter of the silica particles 2 has increased to about 100 nm (1000 Å). in such a case, however, the insulation film 10 tends to show a rough surface not suitable for an interlayer insulation film. It is therefore preferable to limit the diameter of the silica particles 2 below about 50 nm (500 Å) in correspondence to one-tenth the surface roughness of about 500 nm, which is thought to be allowable for an interlayer insulation film used in a multilayer interconnection structure. It should be noted that the diameter of the silica particles is controlled by controlling the pH, temperature and duration of the hydrolysis reaction.

As explained previously, the insulation film 10 thus formed is heat-treated or sintered to cause a sintering in the binder. As a result of the sintering, a rigid neck part 3 of silica is formed between the silica particles 2 as indicated in FIG. 1. By optimizing the sintering condition, it becomes possible to maximize the adherence between the substrate and the insulation film 10.

Figure 3A:
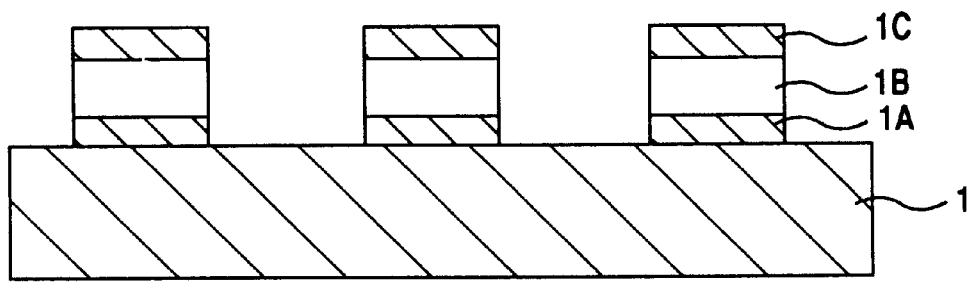
FIGS. 3A and 3B are diagrams explaining the adhesion of the insulation film of the present invention in comparison with the adhesion in a conventional insulation film.
Figure 3B:
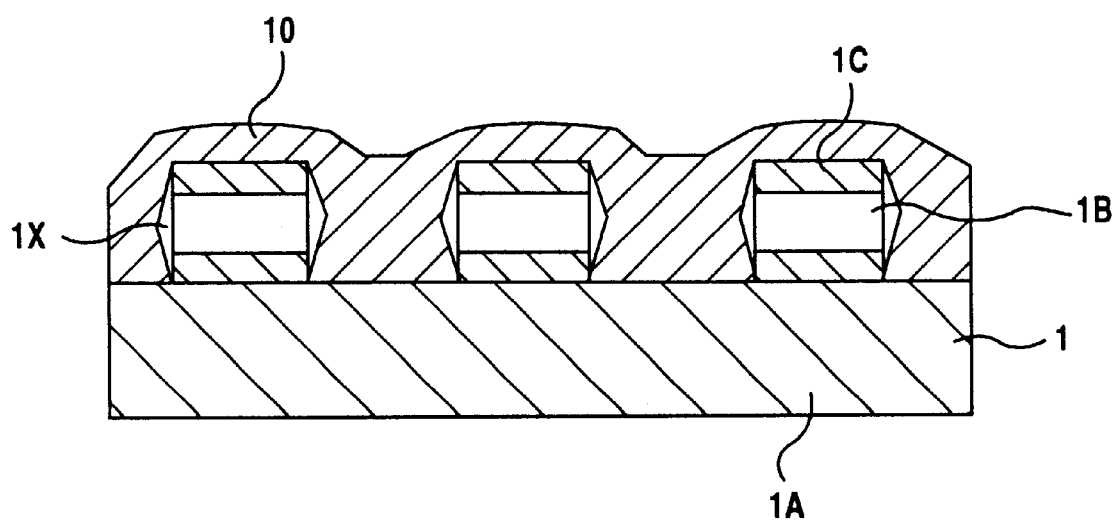

FIGS. 3A and 3B show the sintering process of the insulation film 10 conducted in a model structure.

Referring to FIG. 3A, the model structure includes a Si substrate 1 on which an Al interconnection pattern 1B is formed, with an intervening TiN film 1A interposed therebetween for improving the adherence of the Al interconnection pattern 1B to the Si substrate 1. Further, another TiN film 1C is provided on the interconnection pattern 1B for the same purpose as the TiN film 1A. Further, the insulation film 10 described with reference to FIG. 1 is provided on the structure of FIG. 3A as an interlayer insulation film by a spin-coating process such that the insulation film 10 buries the conductor pattern 1B underneath. By applying a heat-treatment process to the insulation film 10, the void 4 is formed in the insulation film 10 as a result of the sintering of the bridging part 3 forming the neck structure as indicated in FIG. 1.

It should be noted that such a sintering is conducted generally at a temperature of 450° C. or higher in the case of an SOG film. However, it has been discovered that, when the sintering process is conducted at such a high temperature in the case of the insulation film 10 of FIG. 1, the adherence between the interconnection pattern 1B and the insulation film 10 becomes poor and there tends to develop a void 1X between the conductor pattern 1B and the insulation film 10 as indicated in FIG. 3B due to the poor adhesion. The void 1X appears also when the sintering temperature is too low. In such a case, the sintering reaction does not proceed sufficiently.

TABLE I below shows the relationship between the sintering temperature and adhesion for the structure of FIG. 3B.

TABLE I

| temperature | 300° C. | 350 ° C. | 400° C. | 450° C. | 480° C. |
|---|---|---|---|---|---|
| adhesion | bad | excellent | excellent | good | bad | bad with void
good with some void
excellent no void

Referring to TABLE I, it can be seen that a substantial formation of the void 1X occurs between the conductor pattern 1B and the insulation film 10 when the sintering process of the insulation film 10 is conducted at a temperature lower than about 300° C. or higher than about 480° C. When the sintering process is conducted at about 450° C., a slight formation of the void 1X can be seen. By setting the sintering temperature between about 350° C. and 400° C., on the other hand, it was discovered that there is no formation of the void 1X in the multilayer interconnection structure, indicating the maximum adherence of the insulation film 10.

Figure 4:
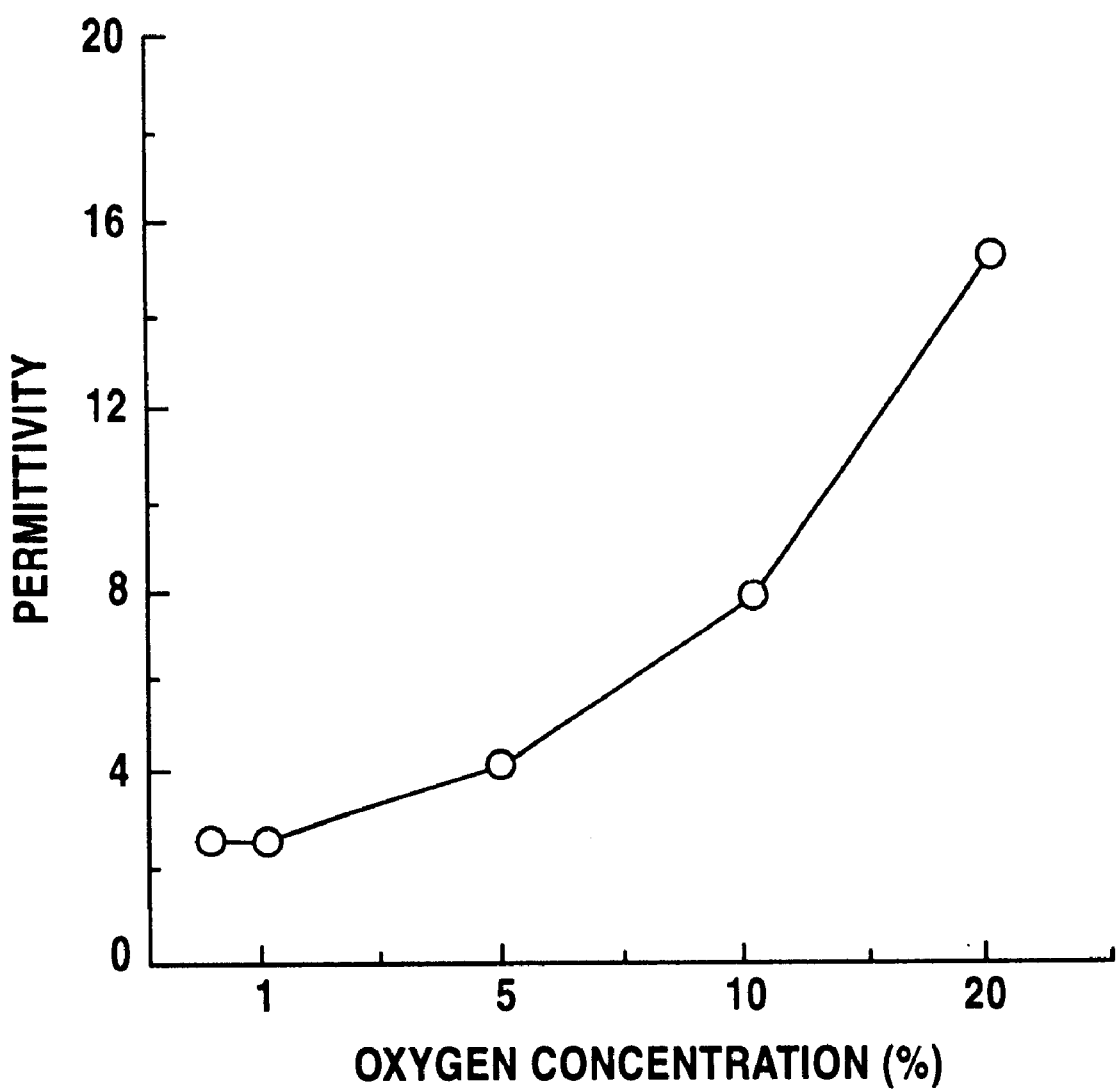
FIG. 4 is a diagram showing the relationship between a permittivity of an insulation film and the oxygen concentration in the atmosphere used for curing the insulation film.

FIG. 4 shows the effect of the atmosphere used at the time of the sintering process on the permittivity of the insulation film 10.

Referring to FIG. 4, the sintering process is conducted in a nitrogen atmosphere while changing the oxygen content in the nitrogen atmosphere variously. The relationship of FIG. 4 indicates that the permittivity of the insulation film 10 increases generally with increasing oxygen content in the nitrogen atmosphere at the time of the sintering process. It is believed that this tendency of FIG. 4 indicates an oxidation reaction occurring in the hydrolysates of alkoxysilane or halogenated silane on the surface of the bonding part 3 or the silica particles 2. As a result of such an oxidation reaction, the surface of the bonding part 3 or the silica particles 2 absorbs a substantial amount of $H_2O$.

From the relationship of FIG. 4, it can be seen that the oxygen content in the nitrogen atmosphere at the time of the sintering process has to be suppressed below 1% in order to suppress the permittivity of the insulation film below about 3.0. It should be noted that the relationship of FIG. 4 is for the case in which the sintering temperature is set to 400° C. The permittivity of the film 10 was obtained by measuring the capacitance of the film 10 by using a mercury probe.

Summarizing above, the silica film formed on a substrate by applying the film-forming liquid of the present invention is converted to a porous silica film having a porous structure when sintered at an optimum temperature and optimum atmosphere. The porous silica film includes a void therein in correspondence to the space between adjacent silica particles that are contained in the film-forming liquid. As the hydrolysates of alkoxysilane or halogenated silane formed on the surface of the void thus formed in the film prevents the adsorption of water on the surface of the void, the porous silica film shows a very low permittivity, typically lower than 3.0. Further, the porous silica film is stable against a high temperature thermal treatment process. In addition, the porous silica film shows an excellent mechanical adherence to the underlying layer due to the anchoring effect of the silica particles. The porous silica film further has various advantageous features such as excellent mechanical strength, excellent resistance to chemicals including alkalis and excellent resistance to cracking. The porous silica film further forms a smooth planarized surface in view of the fact that the silica particles have a diameter of 50 nm or less.

[FIRST EMBODIMENT]

Figure 5A:
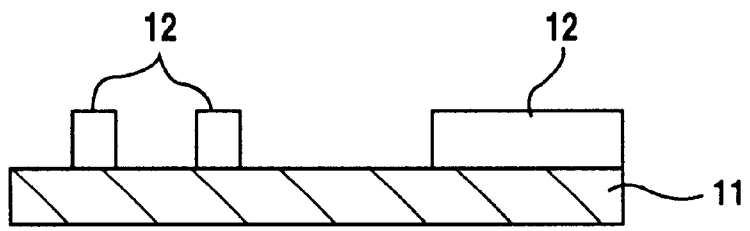
FIGS. 5A–5C are diagrams showing a fabrication process of a semiconductor device according to a first embodiment of the present invention.
Figure 5B:
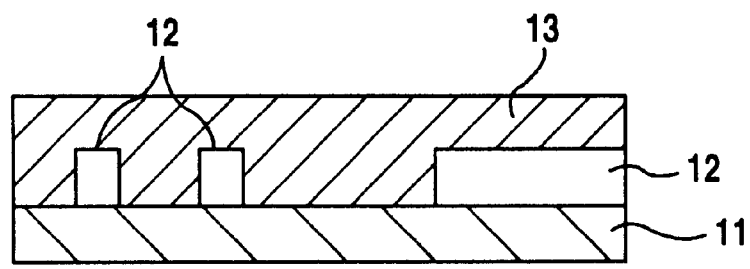
Figure 5C:
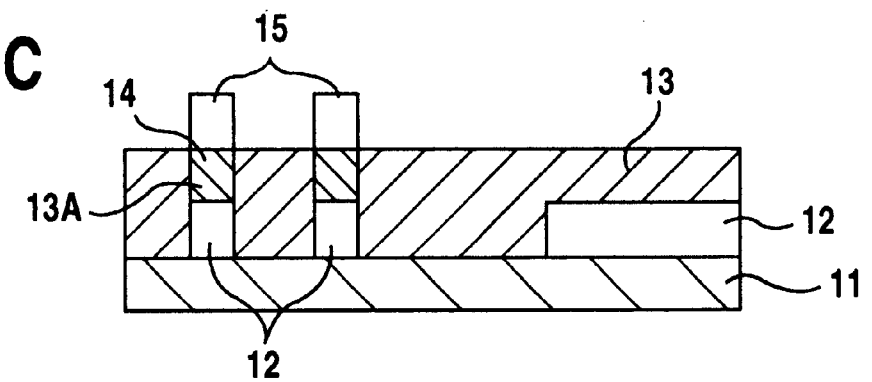

FIGS. 5A–5C are diagrams showing the fabrication process of a semiconductor device according to a first embodiment of the present invention.

Referring to FIG. 5A, a conductor pattern 12 of Al or W is formed on a Si substrate 11 in which one or more semiconductor devices (not shown) are formed, and a film-forming liquid containing: silica particles formed by a hydrolysis and polycondensation of alkoxysilane or a silica compound represented by a general formula of (I) $X_nSi(OR')_{4-n}$ (X may be a hydrogen atom, a fluorine atom or any of an alkyl group, an allyl group or a vinyl group containing 1–8 carbon atoms, R' represents a hydrogen atom or any of an alkyl group, an allyl group or a vinyl group containing 1–8 carbon atoms, n is an integer of 0–3); and a binder formed of a hydrolysate of alkoxysilane represented by the foregoing formula (I) or halogenated silane represented by a general formula (II) $X_nS/X'_{4-n}$ (X represents a hydrogen atom, a fluorine atom or any of an alkyl group, an allyl group or a vinyl group containing 1–8 carbon atoms, X' represents a halogen atom such as a fluorine atom, a chlorine atom, a bromine atom or an iodine atom, and n is an integer of 0–3), is coated on the surface of the Si substrate 11. It should be noted that the Si substrate 11 may include various diffusion regions in an active region defined by a field oxide film not illustrated. Further, the surface of the Si substrate 11 may be covered by a thin thermal oxide film. Thereby, the foregoing conductor pattern 12 may form an electrode or an interconnection pattern.

As a result of the foregoing coating of the film-forming liquid, a silica coating film 13 is formed as an interlayer insulation film with a thickness of 0.1–0.25 μm as indicated in FIG. 5B, such that the silica coating film 13 covers the conductor pattern 12. The silica coating film 13 has an excellent fluidity and the interlayer insulation film 13 thus formed has an excellent planarized top surface.

The structure of FIG. 5B is then sintered at 400° C. for about 30 minutes in an inert atmosphere of nitrogen or argon containing oxygen with a concentration smaller than 1%. As a result of the sintering, the silica binder in the interlayer insulation film 13 forms a neck structure similar to the bonding part 3 explained with reference to FIG. 1. As a result of the sintering process, a void similar to the void 4 explained in FIG. 1 is formed in the interlayer insulation film 13.

Next, in the step of FIG. 5C, a contact hole 13A is formed in the interlayer insulation film 13 so as to expose the conductor pattern 12, and the contact hole 13A is filled by a conductive plug 14 of W, and the like. In the structure of FIG. 5C, a second layer conductor pattern 15 is formed further on the planarized top surface of the interlayer insulation film 13 in electrical connection to the foregoing conductive plug 14.

[SECOND EMBODIMENT]

FIGS. 6A–6D show the fabrication process of a semiconductor device according to a second embodiment of the present invention.

Figure 6A:
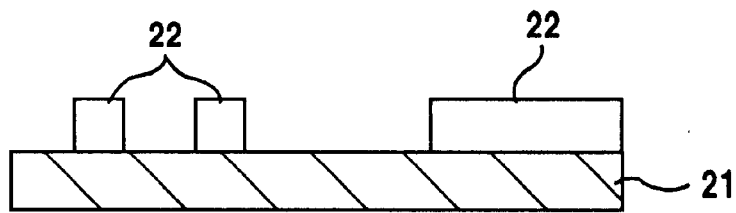
FIGS. 6A–6D are diagrams showing a fabrication process of a semiconductor device according to a second embodiment of the present invention.
Figure 6B:
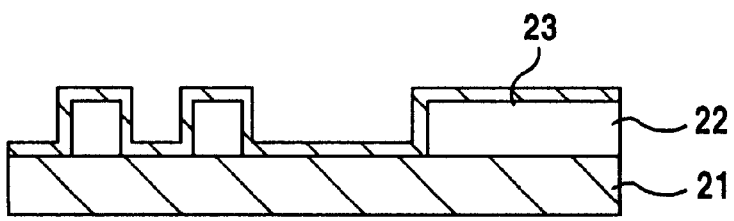

Referring to FIG. 6A, a conductor pattern 22 of Al or W is formed on a Si substrate 21 in which one or more semiconductor devices (not shown) are formed, and an $SiO_2$ film 23 is formed on the structure of FIG. 6A in the step of FIG. 6B by a CVD process such that the CVD-$SiO_2$ film 23 covers the conductor pattern 22.

Figure 6C:
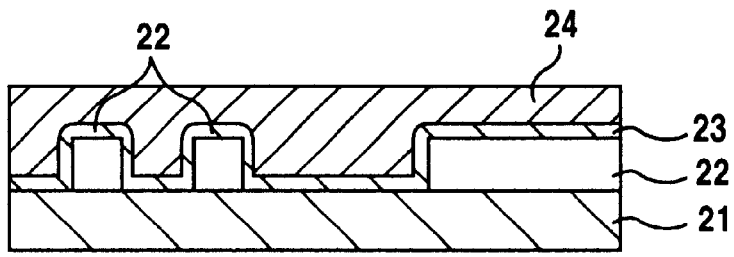

Next, in the step of FIG. 6C, a film-forming liquid similar to the film-forming liquid of the previous embodiment is applied on the structure of FIG. 6B. It should be noted that the Si substrate 21 may include various diffusion regions in an active region defined by a field oxide film not illustrated. Further, the surface of the Si substrate 21 may be covered by a thin thermal oxide film. Thereby, the foregoing conductor pattern 22 may form an electrode or an interconnection pattern.

As a result of the foregoing coating of the film-forming liquid, a silica coating film 24 is formed as an interlayer insulation film with a thickness of 0.1–0.25 μm as indicated in FIG. 6C, such that the silica coating film 23 covers the conductor pattern 22, which is covered by the CVD-$SiO_2$ film as noted before. The silica coating film 24 has an excellent fluidity and the interlayer insulation film 24 thus formed has an excellent planarized top surface.

The structure of FIG. 6C is then sintered at 400° C. for about 30 minutes in an inert atmosphere of nitrogen or argon containing oxygen with a concentration smaller than 1%. As a result of the sintering, the silica binder in the interlayer insulation film 24 forms a neck structure similar to the bonding part 3 explained with reference to FIG. 1. As a result of the sintering process, a void similar to the void 4 explained in FIG. 1 is formed in the interlayer insulation film 24.

Figure 6D:
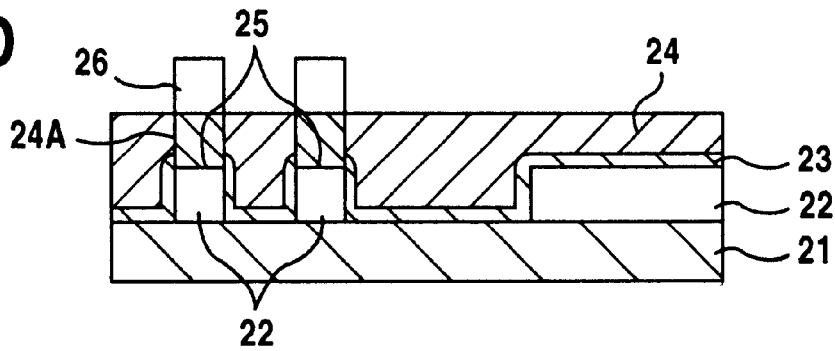

Next, in the step of FIG. 6D, a contact hole 24A is formed in the interlayer insulation film 24 so as to expose the conductor pattern 12, and the contact hole 24A is filled by a conductive plug 25 of W, and the like. In the structure of FIG. 6D, a second layer conductor pattern 26 is formed further on the planarized top surface of the interlayer insulation film 24 in electrical connection to the foregoing conductive plug 25.

[THIRD EMBODIMENT]

FIGS. 7A–7D show the fabrication process of a semiconductor device according to a third embodiment of the present invention.

Figure 7A:
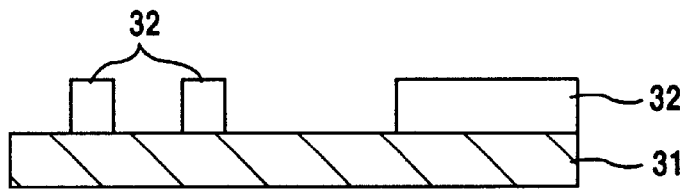
FIGS. 7A–7D are diagrams showing a fabrication process of a semiconductor device according to a third embodiment of the present invention.
Figure 7B:
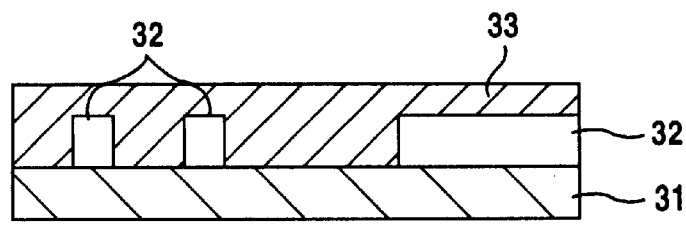

Referring to FIG. 7A, a conductor pattern 32 of Al or W is formed on a Si substrate 31 in which one or more semiconductor devices (not shown) are formed, and a film-forming liquid similar to the film-forming liquid of the first embodiment is applied in the step of FIG. 7B on the structure of FIG. 7A. It should be noted that the Si substrate 31 may include various diffusion regions in an active region defined by a field oxide film not illustrated. Further, the surface of the Si substrate 31 may be covered by a thin thermal oxide film. Thereby, the foregoing conductor pattern 32 may form an electrode or an interconnection pattern.

As a result of the foregoing coating of the film-forming liquid, a silica coating film 33 is formed as an interlayer insulation film with a thickness of 0.1–0.25 μm as indicated in FIG. 7B, such that the silica coating film 33 covers the conductor pattern 32. The silica coating film 33 has an excellent fluidity and the interlayer insulation film 33 thus formed has an excellent planarized top surface.

The structure of FIG. 7B is then sintered at 400° C. for about 30 minutes in an inert atmosphere of nitrogen or argon containing oxygen with a concentration smaller than 1%. As a result of the sintering, the silica binder in the interlayer insulation film 24 forms a neck structure similar to the bonding part 3 explained with reference to FIG. 1. As a result of the sintering process, a void similar to the void 4 explained in FIG. 1 is formed in the interlayer insulation film 33.

Figure 7C:
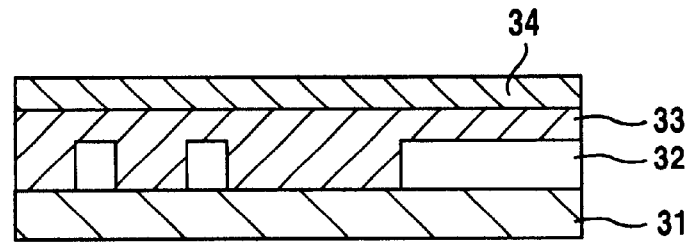
Figure 7D:
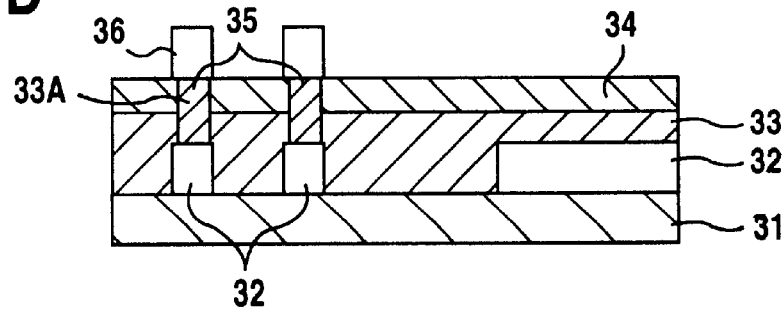

Next, in the step of FIG. 7C, an $SiO_2$ film 34 is formed on the interlayer insulation film 33 by a CVD process with a thickness of 0.1–0.4 μm, and a contact hole 33A is formed through the CVD-$SiO_2$ film 34 and the underlying interlayer insulation film 33 so as to expose the conductor pattern 32 in the step of FIG. 7D. The contact hole 33A is then filled by a conductive plug 35 of W, and the like. In the structure of FIG. 7D, a second layer conductor pattern 36 is formed further on the planarized top surface of the interlayer insulation film 34 in electrical connection to the foregoing conductive plug 35.

[FOURTH EMBODIMENT]

FIGS. 8A–8E show the fabrication process of a semiconductor device according to a fourth embodiment of the present invention.

Figure 8A:
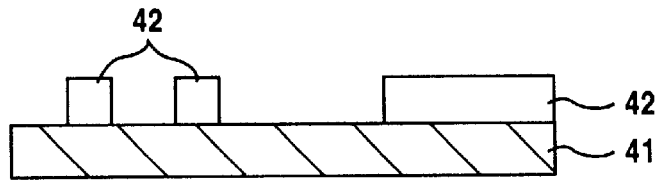
FIGS. 8A–8E are diagrams showing a fabrication process of a semiconductor device according to a fourth embodiment of the present invention.

Referring to FIG. 8A, a conductor pattern 42 of Al or W is formed on a Si substrate 41 in which one or more semiconductor devices (not shown) are formed, and an $SiO_2$ film 43 is formed on the structure of FIG. 8A by a CVD process such that the CVD-$SiO_2$ film 43 covers the conductor pattern 42.

Figure 8B:
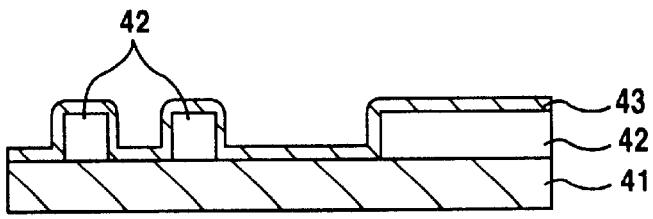
Figure 8C:
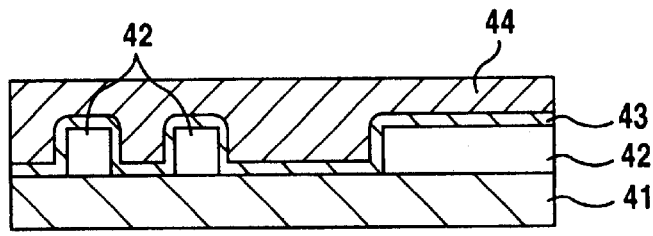

Next, in the step of FIG. 8C, a film-forming liquid similar to the film-forming liquid of the first embodiment is applied to the structure of FIG. 8B, wherein it should be noted that the Si substrate 41 may include various diffusion regions in an active region defined by a field oxide film not illustrated. Further, the surface of the Si substrate 41 may be covered by a thin thermal oxide film. Thereby, the foregoing conductor pattern 42 may form an electrode or an interconnection pattern.

As a result of the foregoing coating of the film-forming liquid, a silica coating film 44 is formed as an interlayer insulation film with a thickness of 0.1–0.25 μm as indicated in FIG. 8C, such that the silica coating film 44 covers the conductor pattern 42, which is covered by the CVD-$SiO_2$ film 43 as noted before. The silica coating film 44 has an excellent fluidity and the interlayer insulation film 44 thus formed has an excellent planarized top surface.

The structure of FIG. 8C is then sintered at 400° C. for about 30 minutes in an inert atmosphere of nitrogen or argon containing oxygen with a concentration smaller than 1%. As a result of the sintering, the silica binder in the interlayer insulation film 24 forms a neck structure similar to the bonding part 3 explained with reference to FIG. 1. As a result of the sintering process, a void similar to the void 4 explained in FIG. 1 is formed in the interlayer insulation film 44.

Figure 8D:
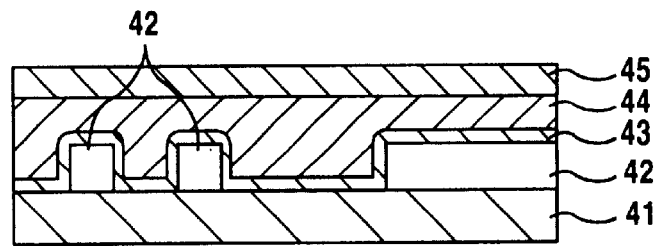
Figure 8E:
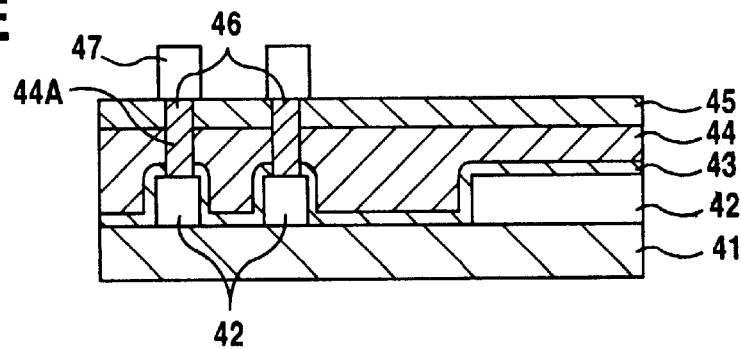

Next, in the step of FIG. 8D, an $SiO_2$ film 45 is formed on the interlayer insulation film 44 by a CVD process with a thickness of 0.1–0.4 μm, and a contact hole 44A is formed through the CVD-$SiO_2$ film 45 and the underlying interlayer insulation film 44 so as to expose the conductor pattern 42 in the step of FIG. 8E. The contact hole 44A is then filled by a conductive plug 46 of W, and the like. In the structure of FIG. 8E, a second layer conductor pattern 47 is formed further on the planarized top surface of the interlayer insulation film 45 in electrical connection to the foregoing conductive plug 46.

In any of the preceding embodiments, it should be noted that the obtained interlayer insulation film has a permittivity of 3 or less and the problem of signal delay or decrease of the operational speed of the semiconductor device is successfully avoided. Further, the interlayer insulation film is stable to moisture and shows an excellent adhesion to the underlying structure.

It should be noted that the substrate in the previous embodiments is by no means limited to a Si substrate but the substrate may be an interlayer interconnection structure similar to the interlayer interconnection structure of the embodiment. In such a case, the thickness of the interlayer insulation film may increase somewhat for achieving a planarization. The interlayer insulation film may have a thickness of 0.3–2.0 μm, for example.

[FIFTH EMBODIMENT]

In the foregoing third and fourth embodiments, an insulation film such as the CVD $SiO_2$ film 34 or 45 is formed on a porous interlayer insulation film such as the interlayer insulation film 33 or 45 by a plasma CVD process. On the other hand, the plasma CVD process applied on such a porous underlying layer may cause a penetration of the CVD-$SiO_2$ film into the pore of the porous underlying layer. See FIG. 9. When the CVD-$SiO_2$ film penetrates into such a pore of the porous interlayer insulation film, the apparent permittivity of the interlayer insulation film increases inevitably.

TABLE II below show the condition of deposition used normally when forming an $SiO_2$ film by a plasma CVD process.

TABLE II

| substrate temperature | 350° C. |
|---|---|
| pressure | 2–3 Torr |
| RF power | 300 W, 13.56 MHz |
| gas flow rate | |
| $SiH_4$ | 40 sccm |
| $N_2O$ | 400 sccm |
| $N_2$ | 2000 sccm |

Figure 9:
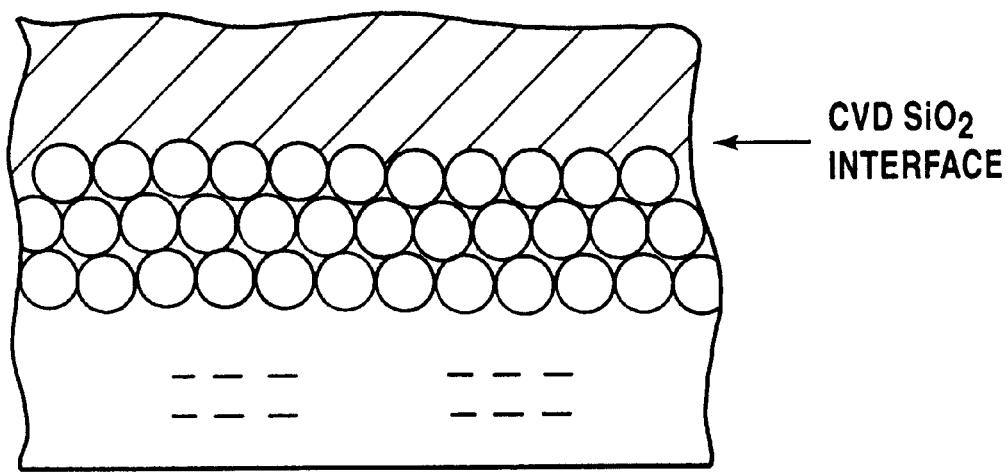
FIG. 9 is a diagram explaining, in relation to a fifth embodiment of the present invention, the problem that occurs when a CVD insulation film is grown directly on a porous interlayer insulation film.

When a CVD $SiO_2$ film is formed under the condition of TABLE II on the porous interlayer insulation film described before, it was discovered experimentally that, while the porous interlayer insulation film itself has a permittivity of 2.45 when the thickness of the film is 340 nm and the CVD-$SiO_2$ film itself has a permittivity of 4.69 when the thickness thereof is 220 nm, the structure in which the CVD-$SiO_2$ film is formed on the porous interlayer insulation film shows an overall permittivity of 3.93 when the total film thickness is 560 nm. This means that the effective permittivity of the silica particles in the porous interlayer insulation film has increased to as much as 4.56, assuming the permittivity of 4.69 for the CVD-$SiO_2$ film. This means that there occurs a substantial penetration of the CVD-$SiO_2$ film into the porous interlayer insulation film as indicated in FIG. 9.

Thus, in the present embodiment, the penetration of the CVD-$SiO_2$ film into the porous interlayer insulation film is minimized, when forming the CVD-SiO$_2$ film from the source gases of SiH$_4$ and TEOS, by increasing the deposition pressure as compared with the normal deposition pressure and by increasing the flow rate of the N$_2$O source gas as indicated in TABLE III below.

TABLE III

| substrate temperature | 350° C. |
|---|---|
| pressure | 5.0–7.0 Torr |
| RF power | 300 W, 13.56 MHz |
| gas fluorite | |
| SiH$_4$ | 40 sccm |
| N$_2$O | 1000–1500 sccm |

When a CVD SiO$_2$ film is formed under the condition of TABLE III on the porous interlayer insulation film, it was discovered that, while the porous interlayer insulation film itself has a permittivity of 2.50 when the thickness of the film is 400 nm and the CVD-SiO$_2$ film itself has a permittivity of 4.54 when the thickness thereof is 200 nm, the structure in which the CVD-SiO$_2$ film is formed on the porous interlayer insulation film shows an overall permittivity of only 3.19, provided that the total film thickness is 600 nm. This means that the effective permittivity of the silica particles in the porous interlayer insulation film is suppressed to 2.45, assuming that the permittivity of the CVD-SiO$_2$ film is 4.54. This means that there occurs no substantial penetration of the CVD-SiO$_2$ film into the porous interlayer insulation film contrary to the case of FIG. 9. In the condition of TABLE III, it is believed that the distance of penetration of the CVD-SiO$_2$ film into the porous interlayer insulation film is less than twice the diameter of the SiO$_2$ particles in the porous interlayer insulation film.

Of course, it is possible to form the CVD-SiO$_2$ film on the porous interlayer insulation film while using a high-density plasma CVD process. TABLE IV below represents an example of the deposition condition for forming such a CVD-SiO$_2$ film while using a high-density plasma CVD process.

TABLE IV

| substrate temperature | 200–450° C. |
|---|---|
| pressure | 5.0–10.0 mmTorr |
| RF power | 2000–4000 W, 13.56 MHz |
| gas flow rate | |
| SiH$_4$ | 78 sccm |
| O$_2$ | 100–400 sccm |
| Ar | 400–480 sccm |

When a CVD SiO$_2$ film is formed under the condition of TABLE IV on the porous interlayer insulation film, it was discovered that, while the porous interlayer insulation film itself has a permittivity of 2.54 when the thickness of the film is 400 nm and the CVD-SiO$_2$ film itself has a permittivity of 4.54 when the thickness thereof is 200 nm, the structure in which the CVD-SiO$_2$ film is formed on the porous interlayer insulation film shows an overall permittivity of only 2.52, provided that the total film thickness is 600 nm. This means that the effective permittivity of the silica particles in the porous interlayer insulation film is suppressed to 2.45, assuming that the permittivity of the CVD-SiO$_2$ film is 4.54. This means that there occurs no substantial penetration of the CVD-SiO$_2$ film into the porous interlayer insulation film contrary to the case of FIG. 9. In the condition of TABLE IV, too, it is believed that the distance of penetration of the CVD-SiO$_2$ film into the porous interlayer insulation film is less than twice the diameter of the SiO$_2$ particles in the porous interlayer insulation film.

[SIXTH EMBODIMENT]

FIGS. 10A–10E show a process of forming a multilayer interconnection structure 50 having a damascene structure according to a sixth embodiment of the present invention.

Figure 10A:
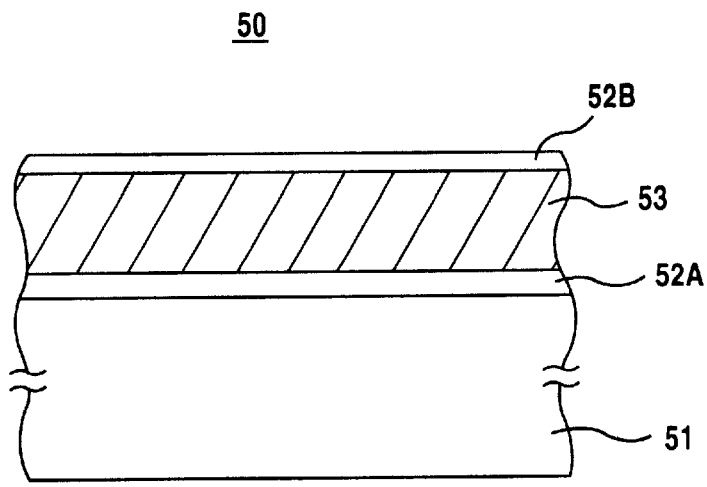
FIGS. 10A–10E are diagrams showing a fabrication process of a multilayer interconnection structure according to a sixth embodiment of the present invention.

Referring to FIG. 10A, an SiO$_2$ film 52A is formed on a substrate 51 by an ordinary CVD process, and a porous interlayer insulation film 53 having the structure of FIG. 1 and including the void 4 therein is formed on the SiO$_2$ film 52A by a spin-coating process. Further, another SiO$_2$ film 52B is formed on the porous interlayer insulation film 53 by a plasma CVD process conducted under the condition of TABLE III.

Figure 10B:
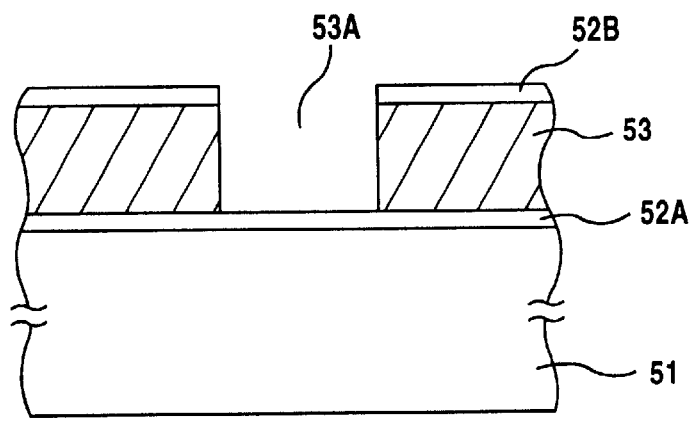
Figure 10C:
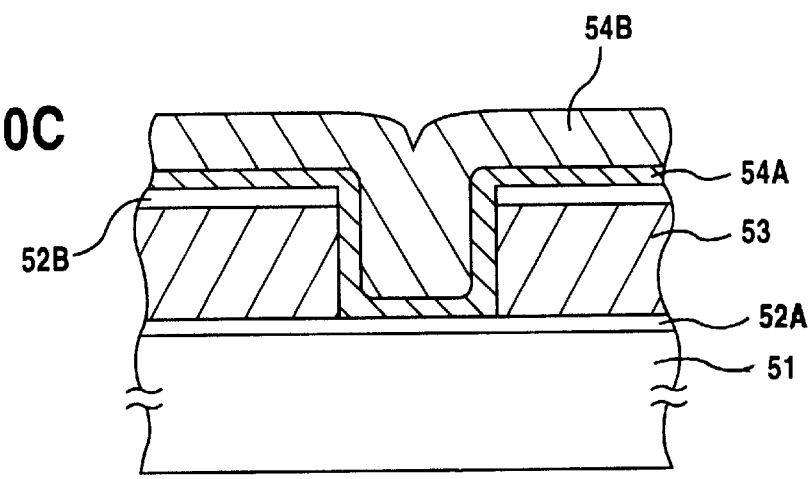

Next, the SiO$_2$ films 52A and 52B as well as the porous interlayer insulation film 53 therebetween are formed with a groove 53A penetrating therethrough in the step of FIG. 10B, and a barrier metal layer 54A of TiN and a conductor layer 54B of Al, Cu or W are deposited consecutively in the step of FIG. 10C on the CVD-SiO$_2$ film 52B so as to fill the groove 53A.

Figure 10D:
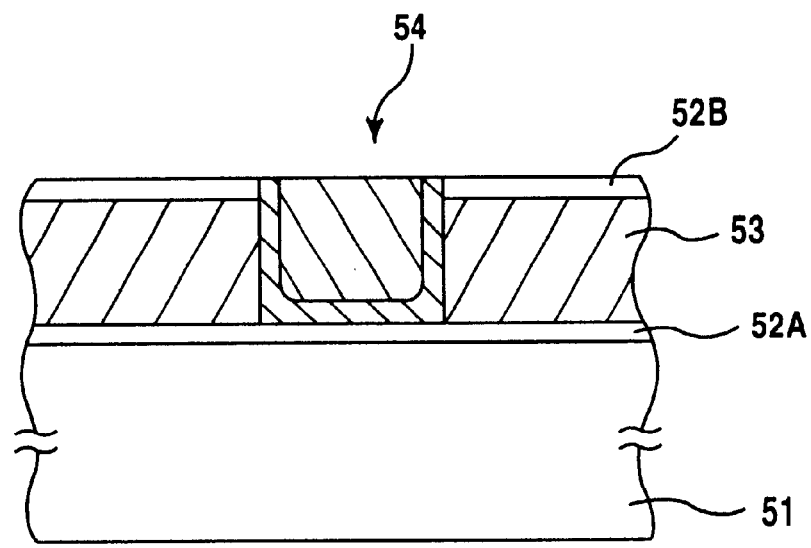

Further, the conductor layer 54B and the barrier metal layer 54A are removed from the top surface of the CVD-SiO$_2$ film by a CMP process and a damascene structure shown in FIG. 10D in which a conductor pattern 54 is embedded in the interlayer insulation film 53 is obtained.

Figure 10E:
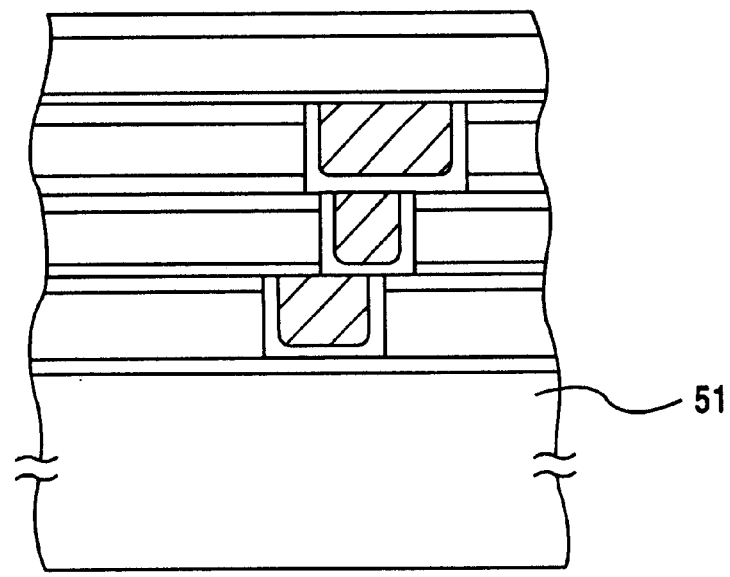

By repeating the foregoing processes, a multilayer interconnection structure shown in FIG. 10E is obtained.

[SEVENTH EMBODIMENT]

FIGS. 11A–11F show a fabrication process of a multilayer interconnection structure 60 having a damascene structure according to a seventh embodiment of the present invention.

Figure 11A:
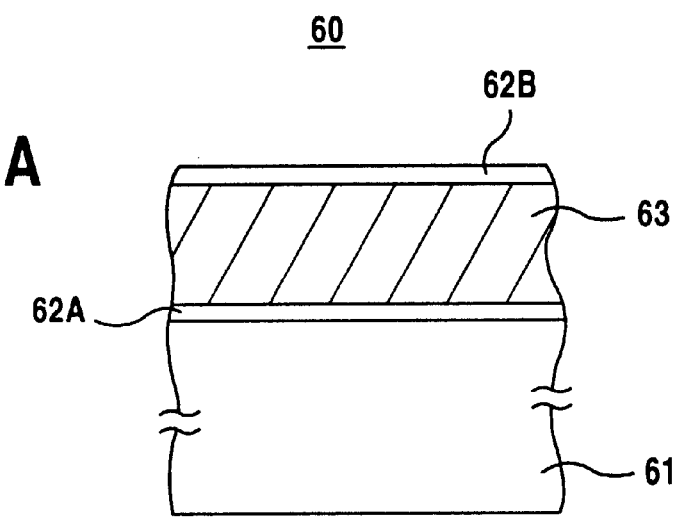
FIGS. 11A–11F are diagrams showing a fabrication process of a multilayer interconnection structure according to a seventh embodiment of the present invention.

Referring to FIG. 11A, an SiO$_2$ film 62A is formed on a substrate 61 by an ordinary CVD process or a plasma CVD process, and a porous interlayer insulation film 63 having the structure of FIG. 1 and including therein a void 4 is formed on the CVD-SiO$_2$ film by a spin coating process. Further, another CVD-SiO$_2$ film 62B is formed on the porous interlayer insulation film 63 by a plasma CVD process conducted under the deposition condition of TABLE III, for example.

Figure 11B:
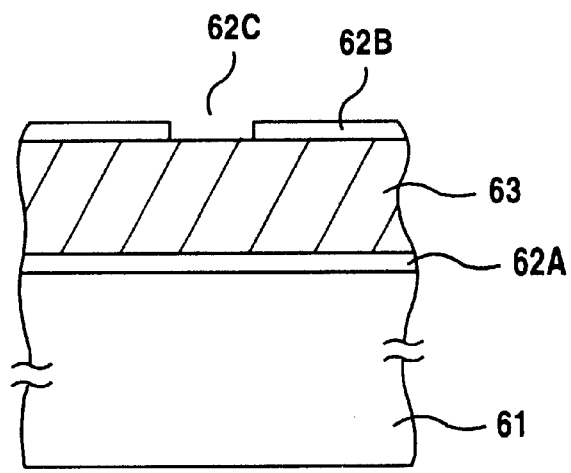
Figure 11C:
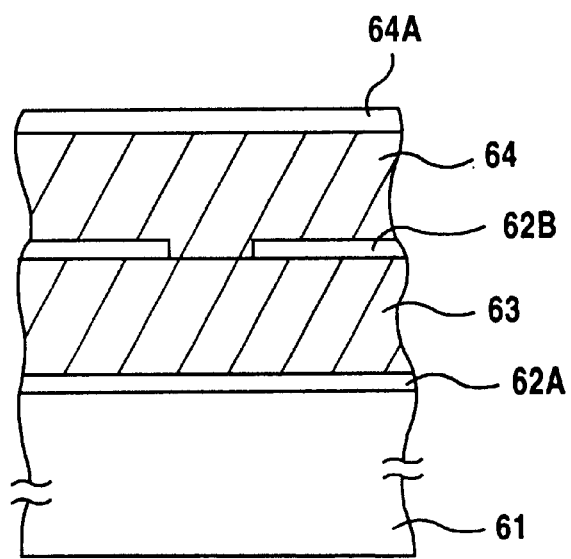

Next, in the step of FIG. 11B, an opening 62C is patterned in the CVD-SiO$_2$ film 62B and another porous interlayer insulation film 64 is formed on the CVD-SiO$_2$ film 62B by a spin coating process such that the interlayer insulation film 64 fills the opening 62C as indicated in FIG. 11C. Further, another CVD-SiO$_2$ 64A is formed on the porous interlayer insulation film 64 by a plasma CVD process similarly to the CVD-SiO$_2$ film 62B in the step of FIG. 11C.

Figure 11D:
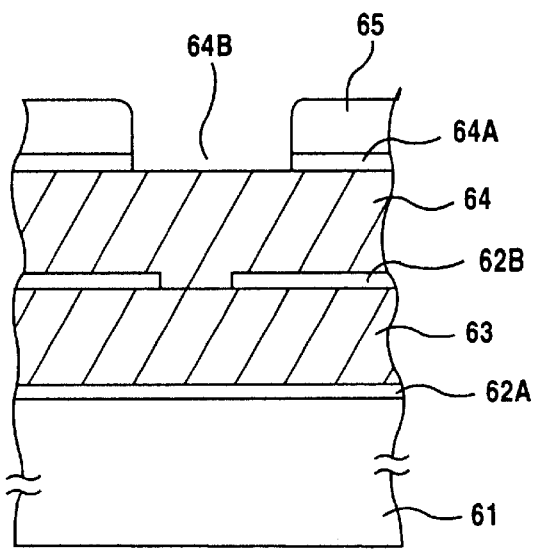

Next, in the step of FIG. 11D, a resist pattern 65 is formed on the CVD-SiO$_2$ film 64A such that the resist pattern 65 has an opening in correspondence to the opening 62C of the CVD-SiO$_2$ film 62B, and the CVD-SiO$_2$ film 64A is patterned by using the resist pattern 65 as a mask to form an opening 64B in the CVD-SiO$_2$ film 64A.

Figure 11E:
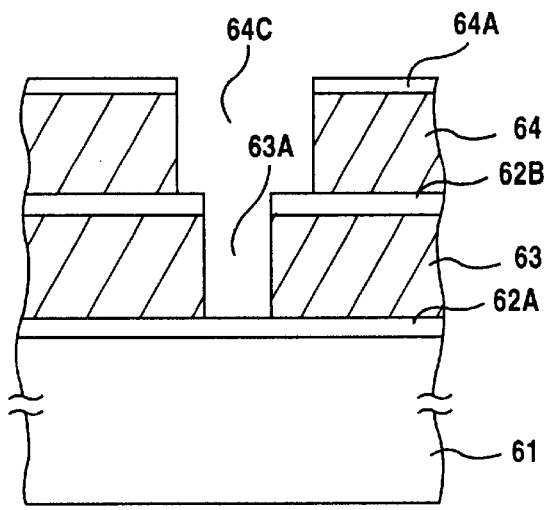

Next, in the step of FIG. 11E, a dry etching process is applied consecutively to the interlayer insulation film 64 and the interlayer insulation film 63 while using the CVD-SiO$_2$ film 64A as a mask, to form a groove 64C in the interlayer insulation film 64 in correspondence to the foregoing opening 64B and further a through hole 63A in the interlayer insulation film 63 in correspondence to the opening 62C such that the through hole 63A has a diameter smaller than the width of the groove 64C. In this process, the CVD-SiO$_2$ film 62B acts also as an etching mask.

Figure 11F:
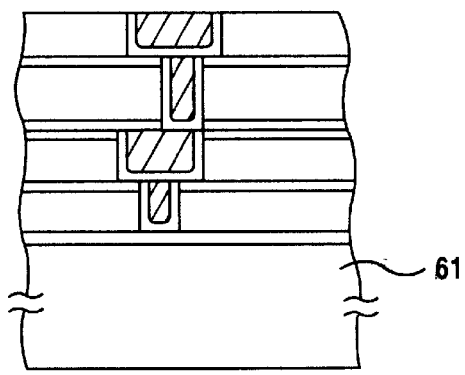

After the step of FIG. 11E, a conductor pattern is formed so as to fill the through hole 63A and the groove 64C, and a multilayer interconnection structure shown in FIG. 11F is obtained.

In the present embodiment, it is also possible to form the foregoing insulation film 62B used for the etching mask from SiN in place of $SiO_2$, which shows an excellent resistance to a dry etching process of $SiO_2$. In this case, the dry etching process of FIG. 11E is advantageously conducted in an Ar atmosphere by using a mixture of $C_{4}F_{8}$ and $CH_2F_2$ as an etching gas, under a pressure of 5 mmTorr while using a bias RF power of 1000 W and a source RF power of 1000W.

[EIGHTH EMBODIMENT]

FIGS. 12A–12E show a fabrication process of a multilayer interconnection structure 70 having a damascene structure according to an eighth embodiment of the present invention.

Figure 12A:
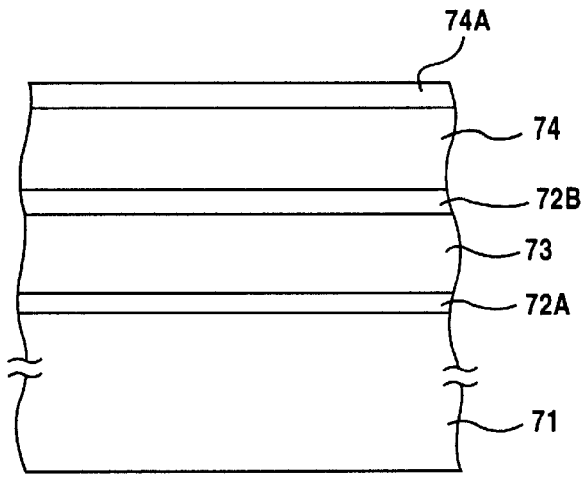
FIGS. 12A–12E are diagrams showing a fabrication process of a multilayer interconnection structure according to an eighth embodiment of the present invention.

Referring to FIG. 12A, an $SiO_2$ film 72A is formed on a substrate 71 according to a normal CVD process or a plasma CVD process, and a porous interlayer insulation film 73 having the structure of FIG. 1 and including the void 4 is formed on the CVD-$SiO_2$ film 72A by a spin coating process. Further, another $SiO_2$ film 72B is formed on the porous interlayer insulation film 73 by a plasma CVD process under the deposition condition of TABLE III, for example, and another porous interlayer insulation film 74 is formed on the CVD-$SiO_2$ film 72B by a plasma CVD process. Further, still other $SiO_2$ film 74A is formed on the porous interlayer insulation film 74 by a plasma CVD process similarly to the CVD-$SiO_2$ film 74A.

Figure 12B:
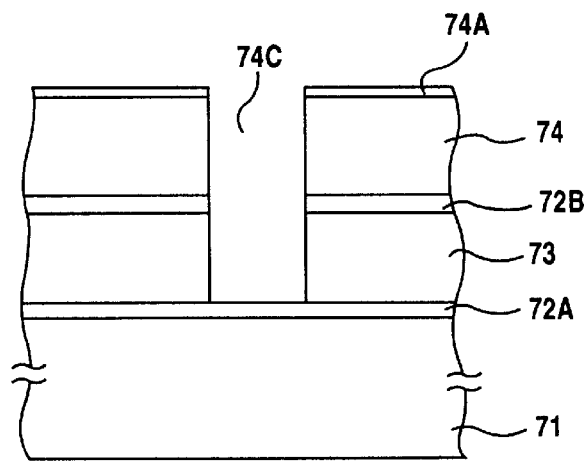

Next, in the step of FIG. 12B, a dry etching process is applied to the porous interlayer insulation films 73 and 74 as well as to the $SiO_2$ films 72B and 74B to form a through hole 74C penetrating the foregoing layers.

Figure 12C:
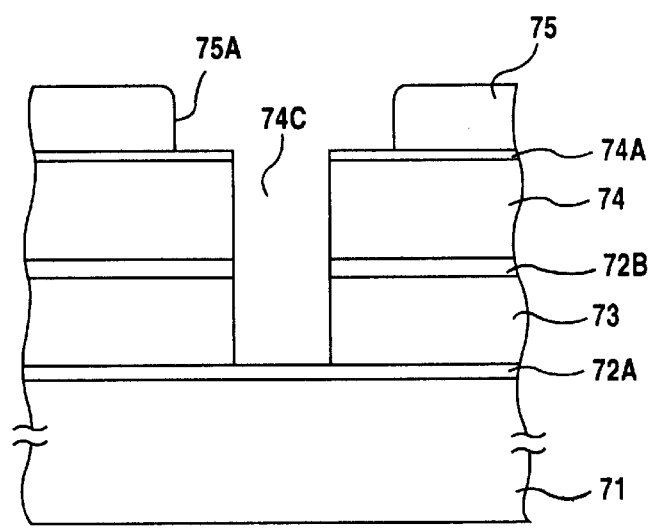
Figure 12D:
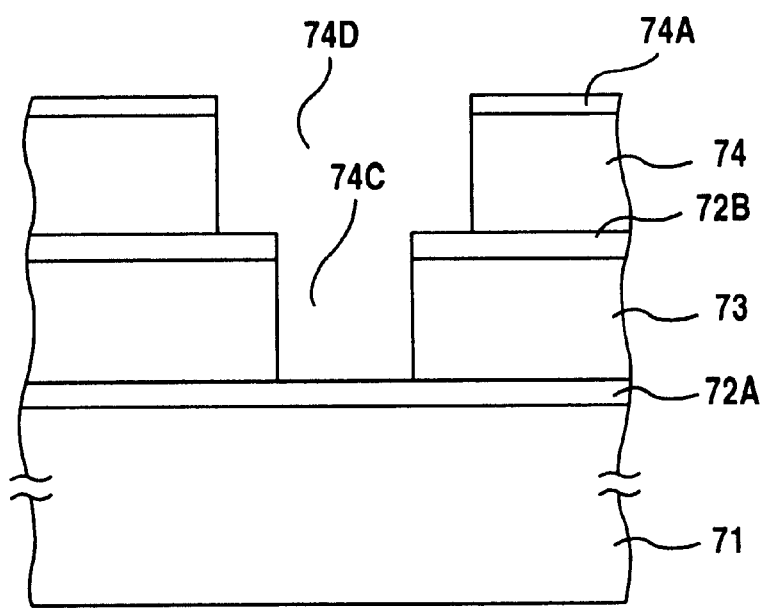

Next, in the step of FIG. 12C, a resist pattern 75 having an opening 75A exposing the through hole 74C is formed on the $SiO_2$ film 74B, and the CVD-$SiO_2$ film 74A as well as the porous interlayer insulation film 74 underneath are patterned while using the resist pattern 75 as a mask, to form a groove 74D in the interlayer insulation film 74 in continuation to the through hole 74C in the interlayer insulation film 73 underneath as indicated in FIG. 12D.

Figure 12E:
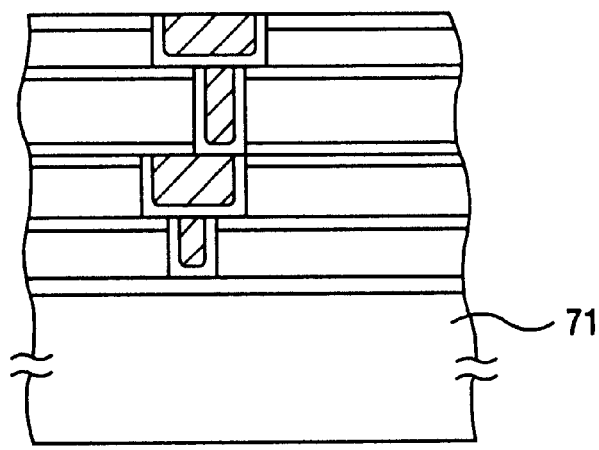

By filling the through-hole 74C and the groove 74D by a conductor layer, a multilayer interconnection structure shown in FIG. 12E is obtained.

In the present embodiment, too, it is possible to use an SiN film for the insulation film 72B. In this case, the dry etching process of FIG. 12D is conducted according to the condition described in the preceding embodiment so as to achieve a maximum selectivity in the etching rate between the SiN film 72B and the porous interlayer insulation film 74.

[NINTH EMBODIMENT]

FIGS. 13A–13D are diagrams showing a fabrication process of a multilayer interconnection structure 80 having a damascene structure according to a ninth embodiment of the present invention.

Figure 13A:
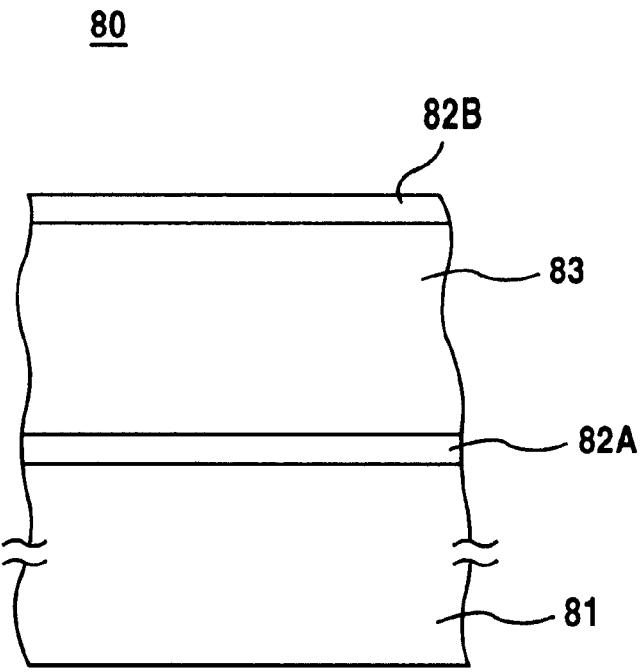
FIGS. 13A–13D are diagrams showing a fabrication process of a multilayer interconnection structure according to a ninth embodiment of the present invention.

Referring to FIG. 13A, an $SiO_2$ film 82A is formed on a substrate 81 according to a normal CVD process or a plasma CVD process, and a porous interlayer insulation film 83 having the structure of FIG. 1 and including the void 4 is formed on the CVD-$SiO_2$ film 82A by a spin coating process. Further, another $SiO_2$ film 82B is formed on the porous interlayer insulation film 83 by a plasma CVD process under the deposition condition of TABLE III, for example.

Figure 13B:
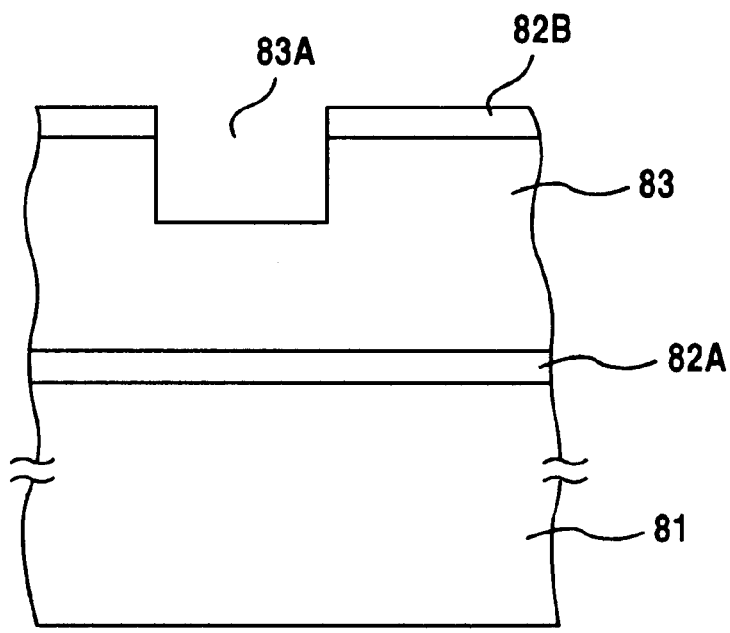

Next, in the step of FIG. 13B, a dry etching process is applied to the foregoing $SiO_2$ film 82 and the porous interlayer insulation film 83 underneath, to form a groove 83A in the interlayer insulation film 83 such that a bottom surface of the groove 83A is located above the bottom surface of the layer 83.

Figure 13C:
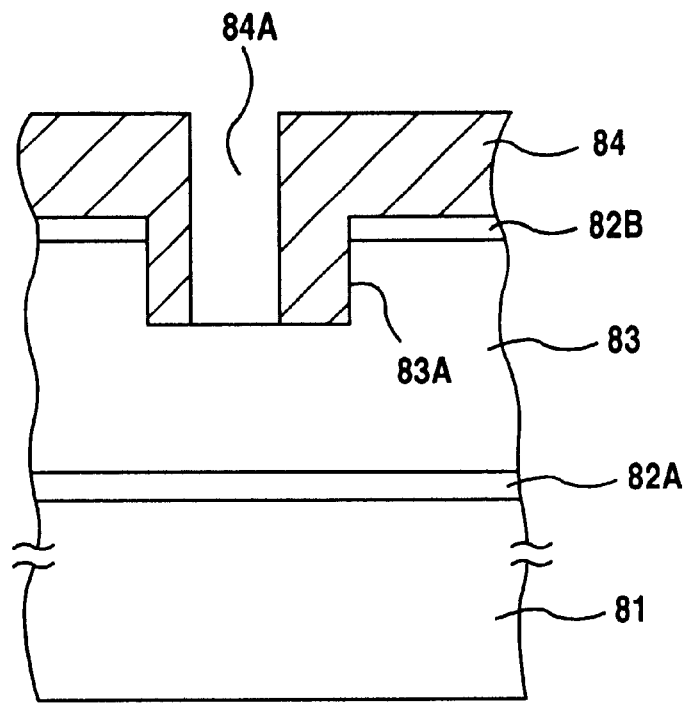
Figure 13D:
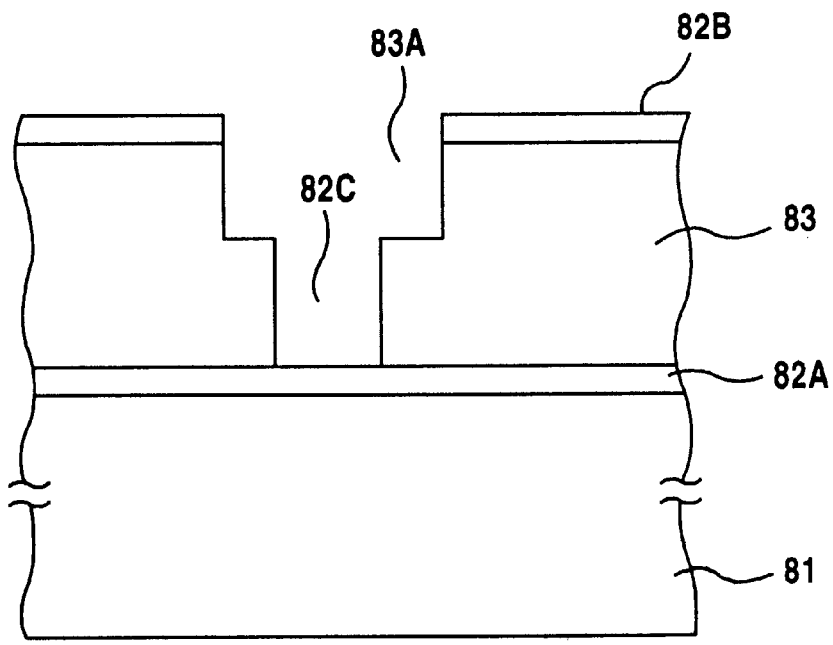

Next, in the step of FIG. 13C, a resist pattern having an opening 84A in correspondence to the groove 83A is formed on the structure of FIG. 13B such that the opening 84A exposes the bottom surface of the groove 83A partially, and a dry etching process is conducted in the step of FIG. 13D while using the resist pattern 84 as an etching mask, to form a contact hole 82C in the groove 83A such that the contact hole 82C penetrates through the interlayer insulation film 83.

By filling the foregoing groove 83A and the contact hole 82C by a conductor pattern, a similar multilayer interconnection structure having a damascene structure is obtained.

Further, the present invention is by no means limited to the embodiments described heretofore, but various variations and modifications may be made without departing from the scope of the invention.

What is claimed is:

1. A method of fabricating a semiconductor device having a multilayer interconnection structure including an interlayer insulation film, comprising the steps of:

applying a film-forming liquid on an underlying structure, said film-forming liquid including therein $SiO_2$ particles and a binder; and heating said underlying structure applied with said film-forming liquid to form an insulation film thereon as said interlayer insulation film, such that said insulation film includes said $SiO_2$ particles and voids formed between said $SiO_2$ particles, wherein said $SiO_2$ particles have a diameter in the range between about 5 nm and about 50 nm, and wherein said step of heating is conducted at a temperature in the range between about 350° C. and about 400° C., in an inert gas atmosphere containing oxygen with a concentration of 1% or less.

2. A method of fabricating a semiconductor device having a multilayer interconnection structure containing an interlayer insulation film, comprising the steps of:

forming an insulation film above a semiconductor structure as a part of said interlayer insulation film; and forming a CVD insulation film on said insulation film in contact with said insulation film as a part of said interlayer insulation film;

said step of forming said insulation film including the steps of:

applying a film-forming liquid above said semiconductor structure, said film-forming liquid containing therein $SiO_2$ particles and a binder, each of said $SiO_2$ particles being substantially a filled particle; and heating said semiconductor structure applied with said film-forming liquid to form an insulation film thereon such that said insulation film includes said $SiO_2$ particles and a void is formed between said $SiO_2$ particles.

3. A method as claimed in claim 2, wherein said step of heating is conducted at a temperature of about 350° C.–about 400° C.

4. A method as claimed in claim 2, wherein a depth of penetration of said insulation film into said interlayer insulation film is limited within about twice a diameter of said $SiO_2$ particles.

5. A method as claimed in claim 2, wherein said step of forming said CVD insulation film includes a step of forming an $SiO_2$ film by a CVD process using $SiH_4$ and $N_2O$ as source materials.

6. A method of fabricating a semiconductor device, comprising the steps of:

forming a first insulation film above an underlying semiconductor structure;

forming a first CVD film on said first insulation film by a CVD process, said first insulation film being in intimate contact with said first CVD film;

forming a first opening in said first CVD film;

forming a second insulation film on said first CVD film;

forming a second CVD film on said second insulation film in intimate contact with said second insulation film;

forming a second opening in said second CVD film in correspondence to said first opening, such that said second opening has a size larger than said first opening;

forming a groove in said second insulation film in correspondence to said second opening, by applying a dry etching process acting selectively to said second insulation film through said second opening, such that said groove penetrates through said second insulation film;

forming a through-hole in said first insulation film in correspondence to said first opening, by applying a dry etching process acting selectively to said first insulation film through said groove and through said first opening; and filling said groove and said through-hole by a conductor pattern;

wherein said first insulation film is formed by: applying a film-forming liquid containing therein $SiO_2$ particles having a diameter in the range between about 5nm and about 50 nm and a binder, above said semiconductor structure; and heating said semiconductor structure applied with said film-forming liquid to form said first insulation film such that said first insulation film includes a void therein between said $SiO_2$ particles; and wherein said second insulation film is formed by: applying a film-forming liquid containing therein $SiO_2$ particles having a diameter in the range between about 5 nm and about 50 nm and a binder, on said first CVD film; and heating said first CVD film applied with said film-forming liquid to form said second insulation film such that said second insulation film includes a void therein between said $SiO_2$ particles;

said step of forming said through-hole in said first insulation film being conducted continuously to said step of forming said groove in said second insulation film.

7. A method of fabricating a semiconductor device, comprising the steps of:

forming a first interlayer insulation film on an underlying semiconductor structure;

forming a first CVD film on said first interlayer insulation film by a CVD process;

forming a second interlayer insulation film on said first CVD film;

forming a second CVD film on said second interlayer insulation film;

forming an opening consecutively through said second CVD film, said second interlayer insulation film, said first CVD film and said first interlayer insulation film; and forming a groove in said second CVD film and said second interlayer insulation film in correspondence to said opening, by applying a dry etching process to said second interlayer insulation film while using said first CVD film as an etching stopper, such that said groove penetrates through said second interlayer insulation film, wherein said first interlayer insulation film is formed by: applying a film-forming liquid containing therein $SiO_2$ particles having a diameter in the range between about 5 nm and about 50 nm and a binder, on said semiconductor structure; and heating said semiconductor structure applied with said film-forming liquid to form said first interlayer insulation film such that said first interlayer insulation film includes a void therein between said $SiO_2$ particles; and wherein said second interlayer insulation film is formed by: applying a film-forming liquid containing therein $SiO_2$ particles having a diameter in the range between about 5 nm and about 50 nm and a binder, on said first CVD film; and heating said first CVD film applied with said film-forming liquid to form said second interlayer insulation film such that said second interlayer insulation film includes a void therein between said $SiO_2$ particles.

8. A method as claimed in claim 2, wherein said step of forming said CVD insulation film is conducted such that CVD insulation film does not penetrate into said void inside said insulation film substantially.

9. A method as claimed in claim 8, wherein said step of forming said insulation film includes a step of forming an $SiO_2$ film by a CVD process using $SiH_4$ and $N_2O$ as source materials.

* * * * *